United States Patent [19]

Kawagoe

[11] 4,145,701
[45] Mar. 20, 1979

[54] SEMICONDUCTOR DEVICE

[75] Inventor: Hiroto Kawagoe, Kodaira, Japan

[73] Assignee: Hitachi, Ltd., Japan

[21] Appl. No.: 934,886

[22] Filed: Aug. 18, 1978

Related U.S. Application Data

[63] Continuation of Ser. No. 611,891, Sep. 10, 1975, abandoned.

[30] Foreign Application Priority Data

Sep. 11, 1974 [JP] Japan .................................. 49/103927

[51] Int. Cl.² ............................................. H01L 27/10
[52] U.S. Cl. ........................................ 357/45; 357/23; 357/41; 357/46
[58] Field of Search ......................... 357/23, 41, 45, 46

[56] References Cited

U.S. PATENT DOCUMENTS

| 3,775,191 | 11/1973 | McQuhae | 357/45 |
| 3,846,768 | 11/1974 | Krick | 357/45 |
| 3,865,651 | 2/1975 | Arita | 357/45 |

Primary Examiner—Edward J. Wojciechowicz
Attorney, Agent, or Firm—Craig & Antonelli

[57] ABSTRACT

In a large scale integrated circuit wherein insulated gate field-effect transistors are arrayed in the shape of a matrix on a single semiconductor substrate, an improvement is provided comprising the fact that some of the transistors are of the depletion type, while others of the transistors are of the enhancement type, so that a very large number of contact holes which are otherwise required for electrical connection between aluminum wiring and the drain regions are unnecessary. This permits the density of integration of the integrated circuit to be raised.

6 Claims, 7 Drawing Figures

SEMICONDUCTOR DEVICE

This is a continuation of U.S. patent application, Ser. No. 611,891, filed Sept. 10, 1975 now abandoned, of which this application claims all benefits.

FIELD OF THE INVENTION

This invention relates to a semiconductor device, more particularly a large scale integrated circuit (LSI), which employs insulated gate field-effect transistors (MIS FET's).

BACKGROUND OF THE INVENTION

Semiconductor devices in the field of information processing require a high density of integration for improving reliability, reduction of costs, etc. As an effective expedient to satisfy these requirement, the LSI have been constructed using a MIS FET as the fundamental element and the respective elements have been integrated on a single semiconductor substrate.

The MIS LSI constructed with the MIS FET as the fundamental element has a structure in which isolation among the elements is unnecessary and the density of integration is increased to that extent. Moreover, when the elements are MIS FET's of the enhancement type, the manufacturing technique is easy and the yield of production is high.

The prior art, however, involves a significant problem. In a multilayer wiring technique indispensable to conventional MIS LIS's, an aluminum wiring is used for electrical interconnection among the electrodes of the respective elements of the MIS LSI. In case of connecting the aluminum wiring and the electrodes of the respective elements, the occupying area of contact holes becomes large due to the dimensional precision of a mask, even when the contact holes are formed by an accurate mask registration and an elaborate photo resist technique. In consequence, the density of integration of the MIS LSI is lowered.

Figure 2:
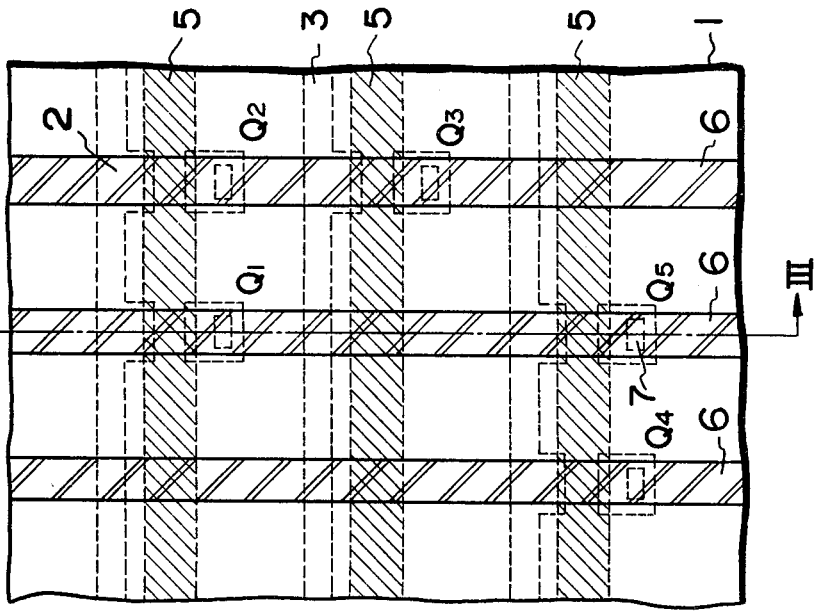
FIGS. 2 and 3 are diagrams showing a pattern in which the prior-art MIS ROM is formed on a single semiconductor substrate.

In the drawing figures, the element 1 is an N-type silicon substrate, the elements 2 and 3 are P-type regions, the element 4 is an insulating film, the element 5 is a polycrystal silicon layer, the element 6 is the aluminum wiring, the element 7 is a contact hole, the line $A_1$, $A_2$, $A_3$, are address wirings, the lines $B_1$, $B_2$, $B_3$, are wirings for output signals, the elements $Q_1$, $Q_2$, $Q_3$, $Q_4$, $Q_5$, are MIS FET's of the enhancement type, $Q_{D1}$, $Q_{D2}$, $Q_{D3}$, $Q_{D4}$, $Q_{D5}$, are MIS FET's of the depletion type, $Q_{E1}$, $Q_{E2}$, $Q_{E3}$, $Q_{E4}$, $Q_{E5}$, are MIS FET's of the enhancement type, and X, X' are symbols of both ends of cutting-plane line.

DESCRIPTION OF THE PRIOR ART

Figure 1:
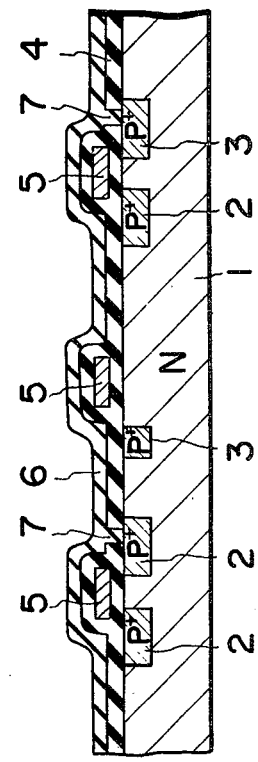
FIG. 1 is a diagram of the schematic array of a prior-art MIS ROM which is used as one of the constituent blocks of a MIS LSI.
Figure 3:
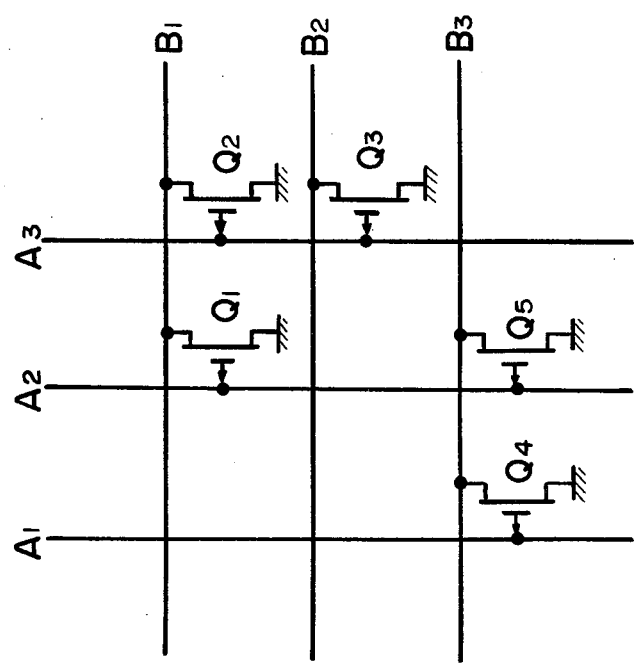

A prior art, insulated gate type read only memory (MIS ROM) used as one of the constituent blocks of the MIS LSI is schematically constructed in the array as shown in FIG. 1. FIGS. 2 and 3 illustrate the pattern of the MIS ROM which is formed on a single semiconductor substrate. In FIG. 1, $Q_1$ - $Q_5$ denote MIS FET's of the enhancement type, $A_1$ - $A_3$ address wirings, and $B_1$ - $B_3$ wirings for output signals. FIG. 3 is a sectional view in which a section indicated by a one-dot chain line in FIG. 2 is depicted in the direction of III—III. In FIGS. 2 and 3, numeral 1 designates an N-type silicon substrate, 2 and 3 indicate P+-type regions which are source or drain region, 4 an insulating film, 5 a polycrystal silicon layer for silicon gates, 6 an aluminum wiring, and 7 a contact hole which electrically connects the aluminum wiring and the P+ -type region for the drain.

As is apparent from FIGS. 1 to 3, the MIS ROM which is constructed using the plurality of MIS FET's of the enhancement type must employ the aluminum wiring as the multilayer wiring in order to connect the drain P+ -type regions of the respective MIS FET's to the output line, and also must be formed with the contact holes on the drain P+ -type regions of the respective MIS FET's in order to establish electrical connection between the aluminum wiring and the drain P+ -type regions. Moreover, the MIS ROM which is constructed of the memory array body as shown in FIG. 3 includes an enormous number of MIS FET's and interconnections. Moreover, when the peripheral circuits of the MIS ROM are added, the numbers of the elements and interconnections increase further. Accordingly, an extremely large number of contact holes for connecting the multilayer wirings of the aluminum wirings and the drain P+ -type regions are required. For this reason, the density of integration of the prior-art MIS LSI including the MIS ROM is decreased.

SUMMARY OF THE INVENTION

It is therefore an object of this invention to provide a semiconductor device in which a plurality of MIS FET's can be placed on a semiconductor substrate at an extraordinarily high density.

The basic construction of this invention for accomplishing these objects consists in a semiconductor device characterized in that a plurality of MIS FET's with source, drain and gate electrodes which are formed on a semiconductor substrate are arranged in the shape of a matrix on the semiconductor substrate and that some of the MIS FET's are of the depletion type, while the others of the MIS FET's are of the enhancement type.

DETAILED DESCRIPTION OF THE INVENTION

Figure 5:
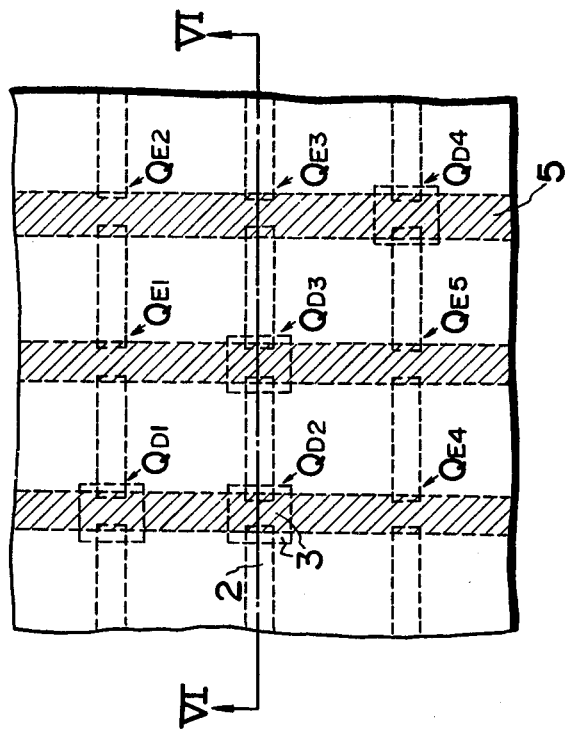
FIGS. 4 to 6b are schematic diagrams showing an embodiment of this invention.
Figure 6B:
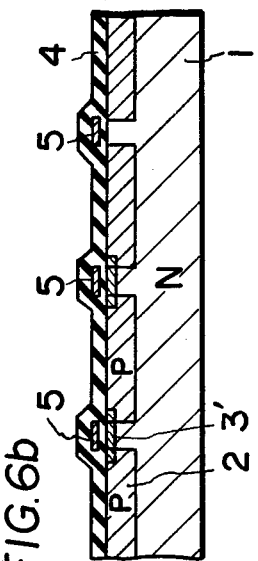
Figure 4:
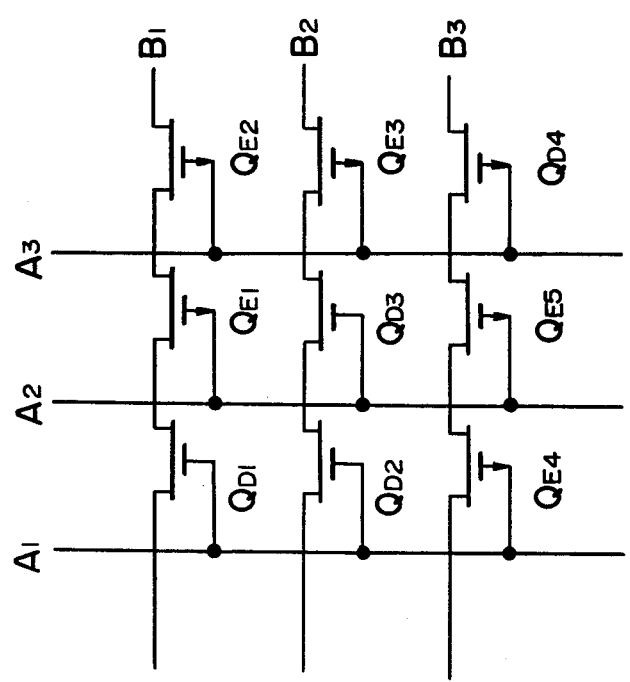
Figure 6A:
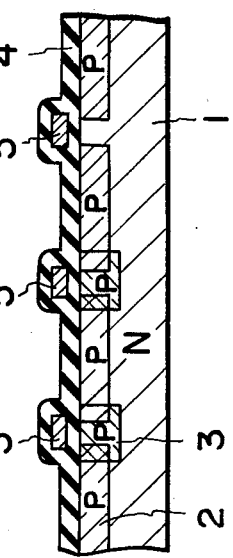

Hereunder the invention will be concretely explained in conjunction with a particular embodiment illustrated in FIGS. 4 - 6 (b). FIG. 4 is a schematic diagram showing a part of a complicated electric circuit in which a MIS ROM is assembled into a MIS LSI of a semiconductor device of this invention, FIG. 5 is a plane view in the case where the electric circuit is formed on a single silicon substrate, and each of FIG. 6 (a) and FIG. 6 (b) is, respectively, a schematic sectional view in which a section is indicated by a one-dot chain line in FIG. 5 and is depicted in the direction of VI—VI. In FIGS. 4 to 6 (b), $A_1$ - $A_3$ denote address wirings, $B_1$ - $B_3$ wirings for output signals, $Q_{E1}$ - $Q_{E5}$ MIS FET's of the enhancement type, and $Q_{D1}$ - $Q_{D4}$ MIS FET's of the depletion type. In FIGS. 5 and 6 (b), numeral 1 designates an N-type silicon substrate, 2 a P+ -type region for a source or drain, 3 or 3' a P-type region for a channel in the MIS FET of the depletion type, 4 an insulating film, and 5 a polycrystalline silicon layer for silicon gates.

A MIS ROM at a very high density of integration can be constructed on a single semiconductor substrate in such a way that a plurality of MIS FET's are arrayed in the shape of a matrix as illustrated in FIG. 4 and that $Q_{E1} - Q_{E5}$ are MIS FET's of the enhancement type, while $Q_{D1} - Q_{D4}$ are MIS FET's of the depletion type.

More specifically, the MIS ROM in this embodiment is composed of MIS FET's of the enhancement type which operate the bits of the MIS ROM (elements of the so-called normally off type in which, at a gate voltage of zero V, no channel is formed and the connection between the source and drain is in the cutoff state, and when a certain threshold voltage is applied to the gate electrode, the channel is formed for the first time and the connection between the source and drain falls into the conductive state), and MIS FET's of the depletion type in which the surface of the N-type silicon substrate underlying the gate electrode is rendered a P-type by thermal diffusion or ion implantation (elements of the so-called on type in which, even at the gate voltage of zero V, the channel is formed and the connection between the source and drain is in the conductive state). The MIS FET's of the depletion type are always in the "on" state, while the MIS FET's of the enhancement type can detect two levels of the "on" state and the "off" state. Accordingly, "1" and "0" are distinguishable, and the operation of the MIS ROM is possible in such a manner that an output signal current is produced in a place where the MIS FET of the enhancement type is connected, when the place is addressed. In case where polysilicon layers are to be used as the gate electrodes and interconnection layers, it is much more preferable to provide the thin or shallow channel layers 3' of the depletion type MOS FETs as shown in FIG. 6 (b) by ion-implantation of an impurity such as boron rather than to provide the thick or deep channel layers 3 thereof as shown in FIG. 6 (a) by thermal diffusion of boron.

Furthermore, since the MIS ROM of this embodiment arrays the MIS FET's of the depletion type and those of the enhancement type in the shape of a matrix, it is unnecessary to employ aluminum wiring as the multilayer wiring, and it is unnecessary to provide the multilayer wiring even in places where the P+ -type regions 2 being the source or drain regions and the polycrystal silicon 5 forming the silicon gate electrodes intersect. Yet furthermore, since the MIS ROM of this embodiment has the drain P+ -type region of each MIS FET connected with the adjacent source P+ -type region by the P- type region, the prior art connection of the drain to ground or to the aluminum wiring as the multilayer wiring by providing the contact hole can be eliminated.

The MIS ROM of this embodiment therefore provides a MIS LSI at an extraorinarily high density of integration. Moreover, the MIS LSI has an increased yield of production and has a high reliability because the manufacturing method is simple and easy.

As is apparent from the foregoing embodiment, this invention can readily be constructed without employing any multilayer wiring the MIS LSI of the circuit arrangement in which the polycrystal silicon layer for the silicon gates and the P+ -type regions for the sources or drains inersect. It is therefore possible to obtain a MIS LSI at a very high density of integration.

This invention is not restricted to the embodiment described above, but it is applicable to semiconductor devices of various aspects. Further, since this invention properly arrays the MIS FET's of the enhancement type and those of the depletion type in the shape of a matrix on a single semiconductor substrate, semiconductor devices can be formed at a very high density of integration and by a simple and easy technique of manufacture.

I claim:

1. A semiconductor integrated circuit device comprising:
    a plurality of insulated gate field-effect transistors each having source and drain regions of a first conductivity type disposed in a substrate of a second conductivity type, opposite said first conductivity type, and a gate electrode overlying a region between the source and drain regions, said plurality of transistors being arranged in the form of a matrix of rows and columns of transistors, the transistors of each row being connected in series through their source and drain paths, wherein said plurality includes both enhancement type transistors and depletion type transistors, and
    a plurality of wirings corresponding to said columns of transistors, the gate electrodes of transistors of each column being connected in common to the corresponding wiring.

2. A semiconductor integrated circuit device according to claim 1, wherein each of said gate electrodes is formed of polycrystalline silicon.

3. A semiconductor integrated circuit device according to claim 2, wherein the polycrystalline silicon gate electrodes of the transistors of each column are formed of the same continuous polycrystalline silicon electrode.

4. A semiconductor integrated circuit device according to claim 1, wherein channel regions of said first conductivity type are formed at said regions between said source and drain regions of said depletion type transistors by ion implantation so as to provide conductive paths between said source and drain regions.

5. A semiconductor integrated circuit device according to claim 4, wherein each ion-implanted channel region extends from the surface of the substrate to a depth less than that of the source and drain regions and overlaps the source and drain regions.

6. A semiconductor integrated circuit device comprising:
    (a) a plurality of conductive layers electrically separated from each other and being substantially arranged in parallel with each other on an insulating layer lying on a semiconductor substrate of a first conductivity type;
    (b) a plurality of diffused regions of a second conductivity type opposite to said first conductivity type being arranged in parallel with each other in said semiconductor substrate and extending so as to cross respective ones of said conductive layers; and wherein
    (c) each of the crossed portions of the conductive layers and the diffused regions acts as MOSFET device, selected ones of said plural MOSFETs being depletion type MOSFETs, and the others of said plural MOSFETS being enhancement type MOSFETs.

* * * * *